United States Patent
Felsl et al.

(10) Patent No.: US 11,018,252 B2
(45) Date of Patent: May 25, 2021

(54) POWER SEMICONDUCTOR TRANSISTOR

(71) Applicant: Infineon Technologies AG, Neubiberg (DE)

(72) Inventors: Hans Peter Felsl, Munich (DE); Moriz Jelinek, Villach (AT); Volodymyr Komarnitskyy, Villach (AT); Konrad Schraml, Feldkirchen (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 16/578,990

(22) Filed: Sep. 23, 2019

(65) Prior Publication Data
US 2020/0098911 A1 Mar. 26, 2020

(30) Foreign Application Priority Data
Sep. 24, 2018 (DE) .......................... 102018123439.2

(51) Int. Cl.
*H01L 29/78* (2006.01)
*H01L 29/66* (2006.01)
*H01L 29/739* (2006.01)

(52) U.S. Cl.
CPC .... *H01L 29/7813* (2013.01); *H01L 29/66348* (2013.01); *H01L 29/66734* (2013.01); *H01L 29/7397* (2013.01)

(58) Field of Classification Search
CPC combination set(s) only.
See application file for complete search history.

(56) References Cited

U.S. PATENT DOCUMENTS

| | | | |
|---|---|---|---|
| 6,660,543 B1 | 12/2003 | Stirton et al. | |
| 10,038,052 B2 * | 7/2018 | Falck | H01L 21/761 |
| 2004/0002203 A1 | 1/2004 | Deshpande et al. | |
| 2008/0001257 A1 * | 1/2008 | Schulze | H01L 29/7396 257/565 |
| 2008/0124902 A1 * | 5/2008 | Schulze | H01L 29/66333 438/525 |

(Continued)

FOREIGN PATENT DOCUMENTS

| | | |
|---|---|---|
| DE | 112015000206 T5 | 8/2016 |
| DE | 112015000670 T5 | 11/2016 |
| DE | 112018000050 T5 | 2/2019 |

*Primary Examiner* — Mamadou L Diallo
(74) *Attorney, Agent, or Firm* — Murphy, Bilak & Homiller, PLLC

(57) ABSTRACT

A power semiconductor transistor includes a semiconductor body having a front side and a backside with a backside surface. The semiconductor body includes a drift region of a first conductivity type and a field stop region of the first conductivity type. The field stop region is arranged between the drift region and the backside and includes, in a cross-section along a vertical direction from the backside to the front side, a concentration profile of donors of the first conductivity type that has: a first local maximum at a first distance from the backside surface, a front width at half maximum associated with the first local maximum, and a back width at half maximum associated with the first local maximum. The front width at half maximum is smaller than the back width at half maximum and amounts to at least 8% of the first distance.

27 Claims, 9 Drawing Sheets

(56) References Cited

U.S. PATENT DOCUMENTS

| | | | | |
|---|---|---|---|---|
| 2010/0244152 A1* | 9/2010 | Bahl | ................... | H01L 27/0922 |
| | | | | 257/408 |
| 2013/0207223 A1* | 8/2013 | Irsigler | ............. | H01L 21/30608 |
| | | | | 257/487 |
| 2014/0217463 A1* | 8/2014 | Schulze | ............ | H01L 29/41766 |
| | | | | 257/139 |
| 2015/0200247 A1* | 7/2015 | Schmidt | ................ | H01L 21/324 |
| | | | | 257/140 |
| 2018/0315813 A1* | 11/2018 | Shiomi | ............... | H01L 29/7396 |

* cited by examiner

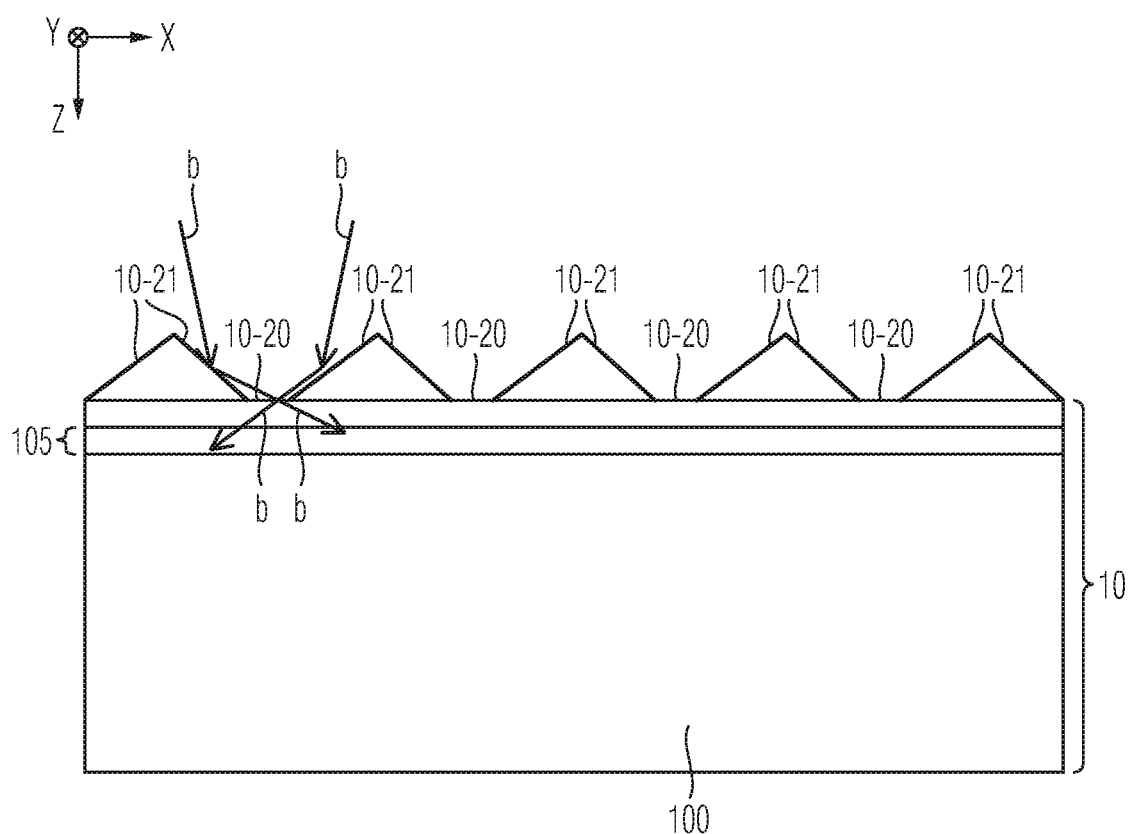

POWER SEMICONDUCTOR TRANSISTOR

TECHNICAL FIELD

This specification refers to embodiments of a power semiconductor transistor. In particular, this specification relates to embodiments of a power semiconductor transistor comprising a field stop region, and to embodiments of processing and/or producing such a power semiconductor transistor.

BACKGROUND

Many functions of modern devices in automotive, consumer and industrial applications, such as converting electrical energy and driving an electric motor or an electric machine, rely on power semiconductor transistors. For example, insulated gate bipolar transistors (IGBTs) and metal oxide semiconductor field effect transistors (MOSFETs), to name a few, have been used for various applications including, but not limited to switches in power supplies and power converters, e.g., in traction applications.

A power semiconductor transistor usually comprises a semiconductor body that is configured for conducting a load current along a load current path between two load terminals of the device. For example, in a vertical arrangement of such a power semiconductor transistor, a first load terminal may be coupled to a front side of the semiconductor body and a second load terminal may be coupled to a backside of the semiconductor body. The load current path usually traverses a drift region of a first conductivity type (e.g., n-type).

Further, the load current path may be controlled by means of an insulated electrode, sometimes referred to as gate electrode. For example, upon receiving a corresponding control signal from, e.g., a driver unit, the control electrode may selectively set the power semiconductor transistor one of a conducting state and a blocking state.

Often, the semiconductor body includes a field stop region (sometimes also referred to as buffer region) of the first conductivity type, wherein the field stop region may be arranged, for example, between the drift region and the backside. The field stop region may be configured for influencing the course of an electric field during the blocking state of the power semiconductor transistor. The field stop region may exhibit donors of the first conductivity type at a higher concentration than the drift region. For example, a drop of the electric field in the blocking state along a direction pointing from the front side to the backside may thus be increased. A field stop region of a semiconductor transistor may come into being, for example, by means of an implantation of protons through the backside of the semiconductor body.

The field stop region may have an influence on a number of further properties of the power semiconductor transistors. It is generally desirable to provide power semiconductor transistors that are optimized with respect to certain electrical properties, such as the short circuit ruggedness, the hot leakage current, and/or the turn-off softness.

SUMMARY

According to first aspect of the disclosure, a power semiconductor transistor comprises a semiconductor body having a front side and a backside with a backside surface. The semiconductor body includes a drift region of a first conductivity type and a field stop region of the first conductivity type. The field stop region is arranged between the drift region and the backside and comprises, in a cross-section along a vertical direction pointing from the backside to the front side, a concentration profile of donors of the first conductivity type that exhibits: a first local maximum at a first distance from the backside surface, a front width at half maximum associated with the first local maximum, and a back width at half maximum associated with the first local maximum, wherein the front width at half maximum is smaller than the back width at half maximum and amounts to at least 8% of the first distance.

According to a second aspect, a method of processing a power semiconductor transistor, comprises providing a semiconductor body having a front side and a backside with a backside surface and creating a field stop region inside the semiconductor body by means of a at least one proton implantation step, wherein the implantation is carried out through the backside surface at an implantation angle with respect to a backside surface normal, the implantation angle being in the range from 20° to 60°. Further, the implantation is carried out at an implantation energy in the range from 100 keV to 800 keV and with an implantation dose yielding an integral of a resulting donor concentration profile in the field stop of at least 20% of a break-through charge that is specific for the material of the semiconductor body.

According to third aspect, a method of processing a power semiconductor transistor, comprises: Providing a semiconductor body having a front side and a backside, the backside having a surface that is defined by a backside surface normal; structuring the backside, such that a plurality of surface portions are formed, which differ from one another in that they have different orientations with respect to the backside surface normal; and creating a field stop region inside the semiconductor body by means of at least one proton implantation step carried out through the backside surface, wherein a proton beam is deflected by the plurality of surface portions during the proton implantation step.

A fourth aspect of the invention relates to a method of producing a power semiconductor transistor, wherein the power semiconductor transistor is a power semiconductor transistor according to the first aspect, the method comprising the method steps according to at least one the second aspect and the third aspect.

Those skilled in the art will recognize additional features and advantages upon reading the following detailed description and upon viewing the accompanying drawings. It should be noted that the power semiconductor transistors according to the first and second aspects of the invention may have been processed or produced by means of method steps according to the third and/or fourth aspect of the invention. Thus, features of the invention that have been described above and will be described in the following with regard to the power semiconductor transistor may analogously apply to the processing and/or producing methods and vice versa.

BRIEF DESCRIPTION OF THE DRAWINGS

The parts in the Figures are not necessarily to scale, emphasis being instead placed upon illustrating principles of the invention. Moreover, in the Figures, like reference numerals designate corresponding parts. In the drawings:

FIG. 8 schematically and exemplarily illustrates a structured backside of a semiconductor body in accordance with one or more embodiments.

DETAILED DESCRIPTION

Figure 1:
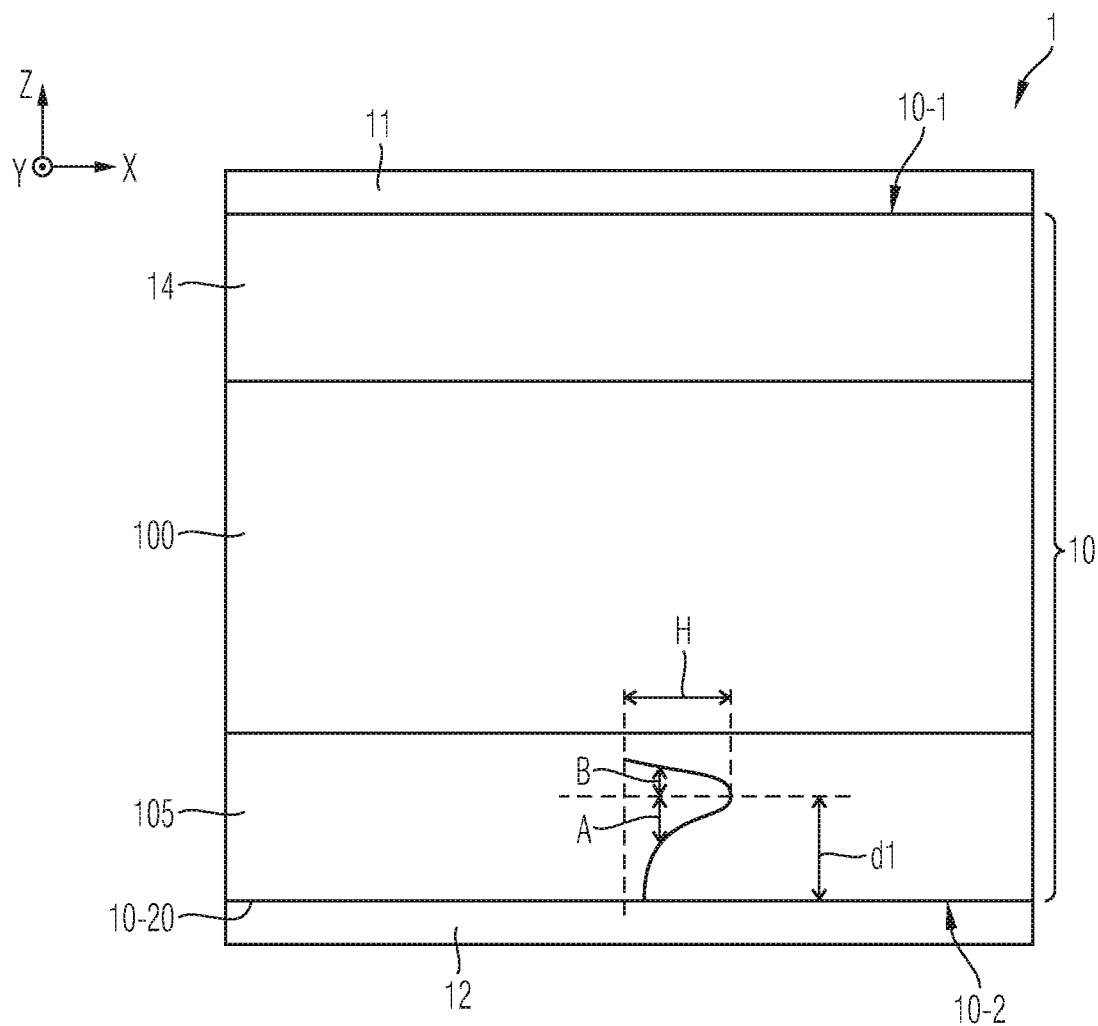
FIG. 1 schematically and exemplarily illustrates a section of a vertical cross-section of a power semiconductor transistor in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the Figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., for example, parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the terms "charge carrier concentration", "dopant concentration" and "donor concentration" may refer to an average charge carrier/dopant/donor concentration or, respectively, to a mean charge carrier/dopant/donor concentration or to a sheet charge carrier/dopant/donor concentration of a specific semiconductor region or semiconductor zone. Thus, e.g., a statement saying that a specific semiconductor region exhibits a certain donor concentration that is higher or lower as compared to a donor concentration of another semiconductor region may indicate that the respective mean concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its generally valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor transistor exhibiting a stripe cell or needle cell configuration, such as a power semiconductor transistor that may be used within a power converter or a power supply. Thus, in an embodiment, the semiconductor transistor is configured for carrying a load current that is to be fed to a load and/or, respectively, that is provided by a power source. For example, the semiconductor device may comprise one or more active power unit cells, such as a monolithically integrated IGBT cell, and/or a monolithically integrated RC-IGBT cell, and/or a monolithically integrated MOSFET cell and/or derivatives thereof. Such transistor cells may be integrated in a power semiconductor module. A plurality of such cells may constitute a cell field that is arranged with an active region of the power semiconductor device.

The term "power semiconductor transistor" as used in this specification intends to describe a semiconductor transistor on a single chip with high voltage blocking and/or high current-carrying capabilities. In other words, such power semiconductor device is intended for high currents, typically in the Ampere range, e.g., up to several ten or hundred Ampere or even up to some kA, and/or high voltages, typically above 100 V, more typically 500 V and above, e.g., up to at least 1 kV, up to at least 6 kV. For example, the semiconductor device described below may be a semiconductor device exhibiting a stripe cell configuration or a needle cell configuration and can be configured for being employed as a power component in a low-, medium- and/or high voltage application.

For example, the term "power semiconductor transistor" as used in this specification is not directed to logic semiconductor devices that are used for, e.g., storing data, computing data and/or other types of semiconductor based data processing.

Figure 2:
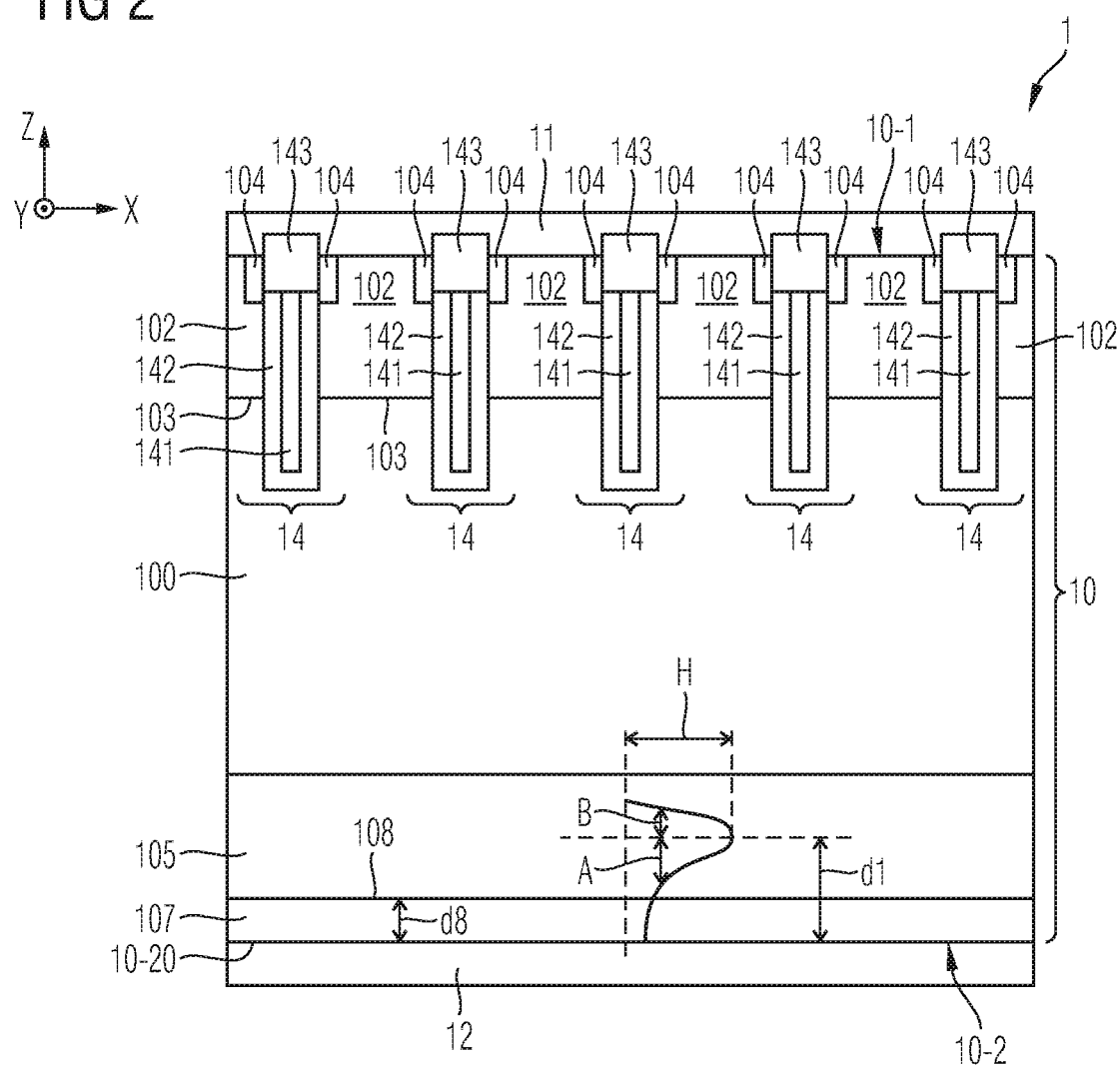
FIG. 2 schematically and exemplarily illustrates a section of a vertical cross-section of a power semiconductor transistor in accordance with one or more embodiments.
Figure 3:
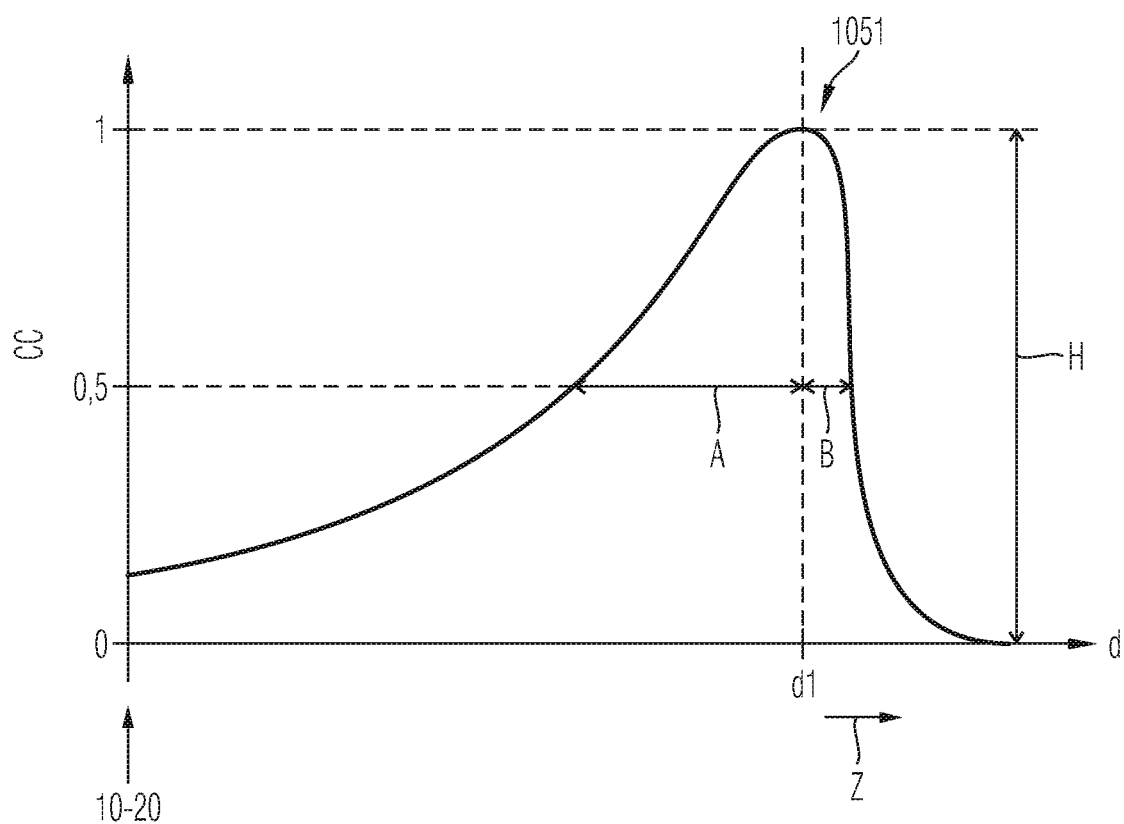
FIG. 3 schematically and exemplarily illustrates a donor concentration profile inside a field stop region in accordance with one or more embodiments.

FIGS. 1 and 2 each schematically and exemplarily illustrate a section of a vertical cross-section of a power semiconductor transistor 1 in accordance with one or more embodiments. The illustrated vertical cross-sections extend within a plane defined by a first lateral direction X and a vertical direction Z and is orthogonal to a second lateral direction Y. Each of the illustrated components may also extend along the second lateral direction Y. In the following, reference will be made to each of FIGS. 1 and 2.

The semiconductor transistor 1 comprises a semiconductor body 10 having a front side 10-1 and a backside 10-2 with a backside surface 10-20. The semiconductor body 10 is coupled to each of a first load terminal structure 11 and a second load terminal structure 12 of the power semiconductor transistor 1. The first load terminal structure 11 may be, for example, an emitter terminal, or a source terminal (depending on the type of power semiconductor transistor) that is, e.g., coupled to the front side 10-1 of the semiconductor body 10. The second load terminal structure 12 may be, for example, a collector terminal, or a drain terminal that is, e.g., coupled to the backside 10-2 of the semiconductor body 10. For example, the first load terminal structure 11 and/or the second load terminal 12 may comprise respective front side or backside metallizations.

The semiconductor body 10 comprises a drift region 100 of a first conductivity type, the drift region 100 being configured for conducting a load current between the first load terminal structure 11 and the second load terminal structure 12. The drift region 100 may comprise dopants of a first conductivity type (e.g., n-type). In an embodiment, the drift region 100 is an n$^-$-doped semiconductor region.

Further, the power semiconductor transistor 1 may comprise one or more control cells 14 that each extend at least partially into the semiconductor body 10 at the front side 10-1. The one or more control cells 14 may be configured for controlling the load current by switching the power semiconductor transistor 1 into one of a conducting state and a blocking state. In other words, the one or more control cells 14 may be configured for selectively conducting a load current or blocking a blocking voltage depending on a switching state of the power semiconductor device 1.

Such control cells 14 may, for example, comprise a control structure such as a MOS-control structure, as illustrated in FIG. 2. The exemplary embodiment shown in FIG. 2 corresponds to an IGBT configuration of the power semiconductor transistor 1. However, the present specification is not limited to a specific kind of configuration of the one or more control cells 14. Rather, the control cells 14 can exhibit any configuration that is common for a power semiconductor transistor, such as an IGBT or a MOSFET. The skilled person is acquainted with these kinds of configurations. Accordingly, in FIG. 1, the one or more control cells 14 are only schematically illustrated, as the exact configuration is not a major subject of this specification.

For example, the control cells 14 depicted in FIG. 2 may exhibit a stripe configuration, which may extend, e.g., throughout an active region of the semiconductor body 10 along the second lateral direction Y. In another embodiment, the control cells 14 may exhibit a cellular configuration, e.g., having a horizontal cross-section exhibiting at least one of a quadratic shape, a rectangular shape, a rectangular shape with rounded corners, a circular shape, and an ellipsoidal shape.

As further illustrated in FIG. 2, each control cell 14 may, e.g., comprise a trench-gate structure. For example, the trench-gate structure may be arranged in one of a stripe configuration and a cellular configuration (e.g., exhibiting a quadratic or rectangular shape in a horizontal cross-section), as mentioned above. For example, each of the control cells 14 may comprise a control electrode 141 arranged inside a trench, wherein the control electrode 141 may be configured for receiving a control signal, such as a gate voltage, from a control terminal (not illustrated) of the power semiconductor transistor 1. For example, within each control cell 14, the control electrode 141 may be electrically insulated from the first load terminal structure 11 by means of an insulation block 143, such as an oxide block, as is well known to those skilled in the art.

Further, each of the cells 14 may comprise a body region 102 of a second conductivity type (e.g., p-type) complementary to the first conductivity type (e.g., n-type) and at least one source region 104 arranged in contact with the first load terminal 11, wherein the body region 102 isolates the at least one source region 104 from the drift region 100. As shown in FIG. 2, a transition between the body region 102 and the drift region 100 forms a pn-junction 103 being configured for blocking a blocking voltage that is applied in forward direction between the first load terminal 11 and the second load terminal 12. Each of the control cells 14 may comprise a portion of said drift region 100.

Inside each control cell 14, the respective control electrode 141 may be electrically insulated from each of the source region 104, the body region 102, and the drift region 100 by means of an insulation structure 142, such as an oxide, being included in the trench. For example, the control electrode 141 may be configured for inducing a transport channel, such as, e.g., and an n-channel, in the body region 102 between the source region 104 and the drift region 100 in dependence of the control signal, thereby enabling the conducting state of the power semiconductor device 1. Instead of such vertical trench cells 14 as illustrated in FIG. 2, the power semiconductor device 1 may be equipped with so called planar switching cells (not shown) wherein a gate electrode is located vertically above the semiconductor body 10. The skilled person is acquainted with the principles and variants of configurations of such trench-based or planar switching cells 14, and they will therefore not be explained in further detail.

As is also well known to those skilled in the art, the semiconductor body 10 may further comprise a backside emitter region 107 of the second conductivity type (e.g., p-type) that may be arranged at the backside 10-2 in contact with the second load terminal 12, see FIG. 2. In this case, the power semiconductor device 1 may be configured as an IGBT. In another variant, wherein the power semiconductor device 1 is configured, e.g., as a MOSFET, such a backside emitter region 107 of the second conductivity type may be absent and a highly doped n-type region may be provided. For example, the backside emitter region 107 may have come into being by a diffusion process and/or by an implantation process through the backside surface 10-20 followed by a subsequent annealing step at temperatures below 440° C. In some embodiments, producing the backside emitter region 107 may further involve an activation process by means of a LASER, wherein an irradiation with the LASER is carried out through the backside 10-2.

Further, the semiconductor body 10 comprises a field stop region 105 of the first conductivity type. The field stop region 105 is arranged between the drift region 100 and the backside 10-2. It should be noted that, in the present context, the relation "between" is to be understood in a broad sense, i.e., there may be arranged further elements, such as the backside emitter region 107, between the field stop region 105 and the backside 10-2, see FIG. 2. As is in principle known to those skilled in the art, such a field stop region 105 may be provided for influencing the course of an electric field especially during the blocking state of the power semiconductor transistor 1. The field stop region 105 may comprise donors of the first conductivity type at a higher concentration than the drift region 100. For example, a drop of the electric field in the blocking state along a direction pointing from the front side 10-1 to the backside 10-2 (i.e., along a direction opposite to the vertical direction Z) may thus be increased. The field stop region 105 may have come into being, for example, by means of an implantation of protons through the backside surface 10-20 of the semiconductor body 10. For example, such an implantation process may be followed by a subsequent annealing step at temperatures below 440° C.

In an embodiment in accordance with FIG. 2, a transition between the backside emitter region 107 and the field stop region 105 forms a second pn-junction 108. For example, the second pn-junction 108 is located at a distance d8 in the range from 100 nm to 500 nm from the backside surface 10-20 (see also FIG. 4).

In a cross-section along the direction pointing from the backside 10-2 to the front side 10-1 (i.e., along a direction defined by a normal N on a backside surface 10-2 or, equivalently, along the vertical direction Z), the field stop region 105 may comprise a concentration profile of donors of the first conductivity type that is exemplarily depicted in each of FIGS. 1 and 2. More detailed illustrations of a section such a donor concentration profile inside the field stop region 105 are schematically and exemplarily shown in FIGS. 4 to 6. In the following, reference will be made to the donor concentration profiles shown in each of FIGS. 1 to 6.

In an embodiment at least 80%, such as at least 60% of the donors in the field stop region 105, i.e., at least 80%, such as at least 60% of the donors forming said donor concentration profile, are hydrogen-induced donors. For example, such hydrogen-induced donors may have been created by means of an implantation process followed by an annealing process, as will be described further below.

The donor concentration profile may exhibit a first local maximum 1051 at a first distance d1 from the backside 10-2 (i.e., from the backside surface 10-2). For example, the first distance d1 is equal to or smaller than 4 μm, such as at most 3.75 μm. In other words, the first local maximum 1051 may be situated relatively shallow with regard to the backside surface 10-2. On the other hand, in an embodiment, the first distance d1 may be equal to or larger than 0.3 μm, such as at least 0.350 μm.

Further, the donor concentration profile may exhibit a front width at half maximum B associated with the first local maximum 1051, wherein the front width at half maximum B amounts to at least 8%, such as at least 10%, at least 12%, or even at least 20% of the first distance d1.

In the following, the definition of the front width at half maximum B will be explained with reference to the FIGS. 1-3, 5, and 6. It should be noted that, in FIGS. 4 and 5, the solid lines represent donor concentration curves in accordance with the present invention, whereas dotted lines are reference curves shown for the purpose of comparison. In the following, reference will be made to the solid curves if not stated otherwise. As can be seen, e.g., in each of FIGS. 3, 5 and 6, the first local maximum 1051 of the donor concentration CC exhibits a concentration height H that is defined as the difference between the donor concentration CC at the first local maximum 1051 and the donor concentration CC at a local minimum that is neighboring the first local maximum 1051 in the direction towards the front side 10-1 (i.e., that is located further in the vertical direction Z). For example, in the exemplary embodiments of FIGS. 3 and 5, the local minimum may be at the same time a global minimum that is located at the rightmost edge of the concentration profile (or even to the right of the range depicted in FIGS. 3 and 5). The concentration height H is thus the difference between the concentration at the first local maximum 1051 and the bottom line in FIGS. 3 and 5, i.e., the concentration at the rightmost edge of the diagram shown in FIGS. 3 and 5. By contrast, in the exemplary embodiment of FIG. 6, a local minimum is located between the first local maximum 1051 and a second local maximum 1052.

The front width at half maximum B is defined as the distance between the position d1 of the first local maximum 1051 and the point of the donor concentration curve where the donor concentration CC has dropped to half of the concentration height H when going from the first local maximum 1051 in the direction of the front side 10-1 (i.e., in the vertical direction Z). In the exemplary embodiments of FIGS. 3 and 5, the ordinate indicates the donor concentration CC in units normalized to the height H. In other, words, the concentration CC at the first local maximum 1051 is 1.0, and the concentration CC at the local minimum is 0.0. Thus, the front width at half maximum B is measured at the value 0.5 in the normalized scale of FIGS. 3 and 5.

Correspondingly, a back width at half maximum A associated with the first local maximum 1051 is defined as the distance between the position d1 of the first local maximum 1051 and the point of the donor concentration curve where the donor concentration has dropped to half of the concentration height H when going from the first local maximum 1051 in the direction of the backside 10-2 (i.e., in the direction opposite to the vertical direction Z). The sum of the front width at half maximum B and the back width at half maximum A corresponds to a full width at half maximum A+B.

In an embodiment in accordance with each of FIGS. 1 to 6, the front width at half maximum B is smaller than the back width at half maximum A. For example, the front width at half maximum B may even be smaller than half of the back width at half maximum A.

In an embodiment in accordance with each of FIGS. 1 to 6, the front width at half maximum B amounts to at least 0.225 μm, such as at least 0.250 μm, at least 0.275 μm or even at least 0.375 μm. Further, in an embodiment, the back width at half maximum A associated with the first local maximum 1051 may be at least 0.675 μm, such as at least 0.700 µm or even at least 0.725 µm. For example, the full width at half maximum A+B associated with the first local maximum 1051 is at least 0.9 µm, such as at least 1.0 µm. or even at least 1.1 µm.

Figure 5:
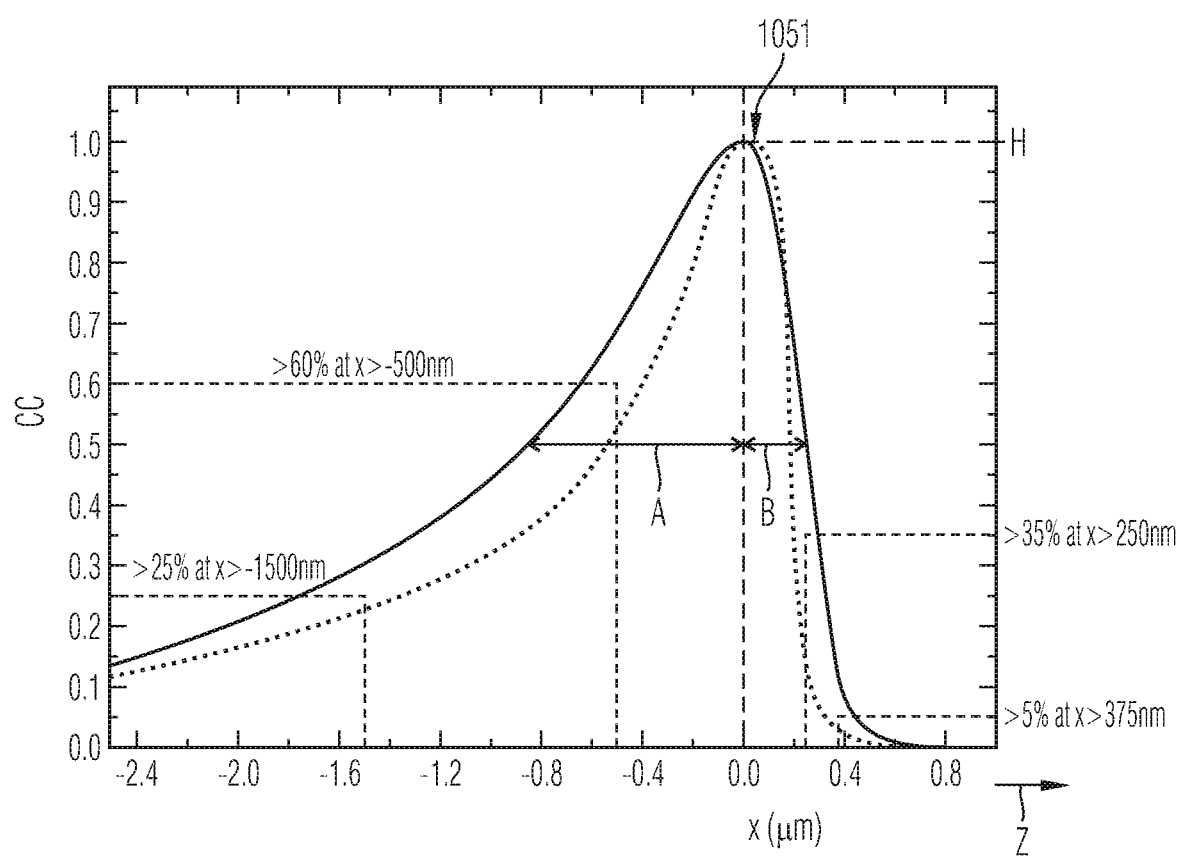
FIG. 5 schematically and exemplarily illustrates a donor concentration profile inside a field stop region in accordance with one or more embodiments.

Further, in an embodiment in accordance with FIG. 5 (solid curve), the concentration profile may be characterized in that, at a distance of 250 nm from the position of the first local maximum 1051 in the direction of the front side 10-1, the donor concentration is at least 35% of the donor concentration at the first local maximum 1051.

Further, in an embodiment in accordance with FIG. 5 (solid curve), the donor concentration profile may be characterized in that, at a distance of 375 nm from the position of the first local maximum 1051 in the direction of the front side 10-1, the donor concentration is at least 5% of the donor concentration at the first local maximum 1051.

Further, in an embodiment in accordance with FIG. 5 (solid curve), the donor concentration profile may be characterized in that, at a distance of 500 nm from the position of the first local maximum 1051 in the direction of the backside 10-2, the donor concentration amounts to at least 60% of the donor concentration at the first local maximum 1051.

Further, in an embodiment in accordance with FIG. 5 (solid curve), the concentration profile may be characterized in that, at a distance of 1500 nm from the position of the first local maximum 1051 in the direction of the backside 10-2, the donor concentration is at least 25% of the donor concentration at the first local maximum 1051.

For comparison, FIG. 5 also depicts a donor concentration profile (dotted reference curve) that does not exhibit all of the characteristic features underlying the present invention. For example, while a local maximum of the dotted reference curve is situated approximately at the same distance d1 from the backside surface 10-20 as the first maximum 1051 of the solid curve, it has a front width at half maximum that is smaller than 8% of said distance d1. Further, the full width at half maximum of the reference curve is less than 0.9 µm.

In an embodiment, the donor concentration of the first conductivity type inside the field stop region 105 may be relatively homogeneous in a lateral direction, such as in one or both of the first and second lateral direction X, Y (see, e.g., FIGS. 1 and 2). For example, along at least 80% of an extension of the field stop region 105 along a lateral direction, such as along one or both of the first and second lateral directions X, Y perpendicular to the vertical direction Z, the donor concentration at the first local maximum 1051 may vary by less than 10%. Additionally or alternatively, in an active area of the power semiconductor transistor 1, the donor concentration at the first local maximum 1051 may vary by less than 10% along a lateral direction X, Y perpendicular to the vertical direction Z.

In an embodiment in accordance with FIG. 2, wherein the semiconductor body 10 comprises a backside emitter region 107 of the second conductivity type, and wherein a transition between the backside emitter region 107 and the field stop region 105 forms a second pn-junction 108, a current amplification factor $\alpha_{pnp/npn}$ of a partial transistor that is formed by the backside emitter region 107, the field stop region 105, the drift region 100, and the body regions 102 of the control cells 14 may vary along a lateral direction X, Y perpendicular to the vertical direction Z by less than 10%. For example, such a lateral homogeneity of the current amplification factor $\alpha_{pnp/npn}$ may be facilitated by the lateral homogeneity of the donor concentration at the first local maximum 1051 described above.

Figure 6:
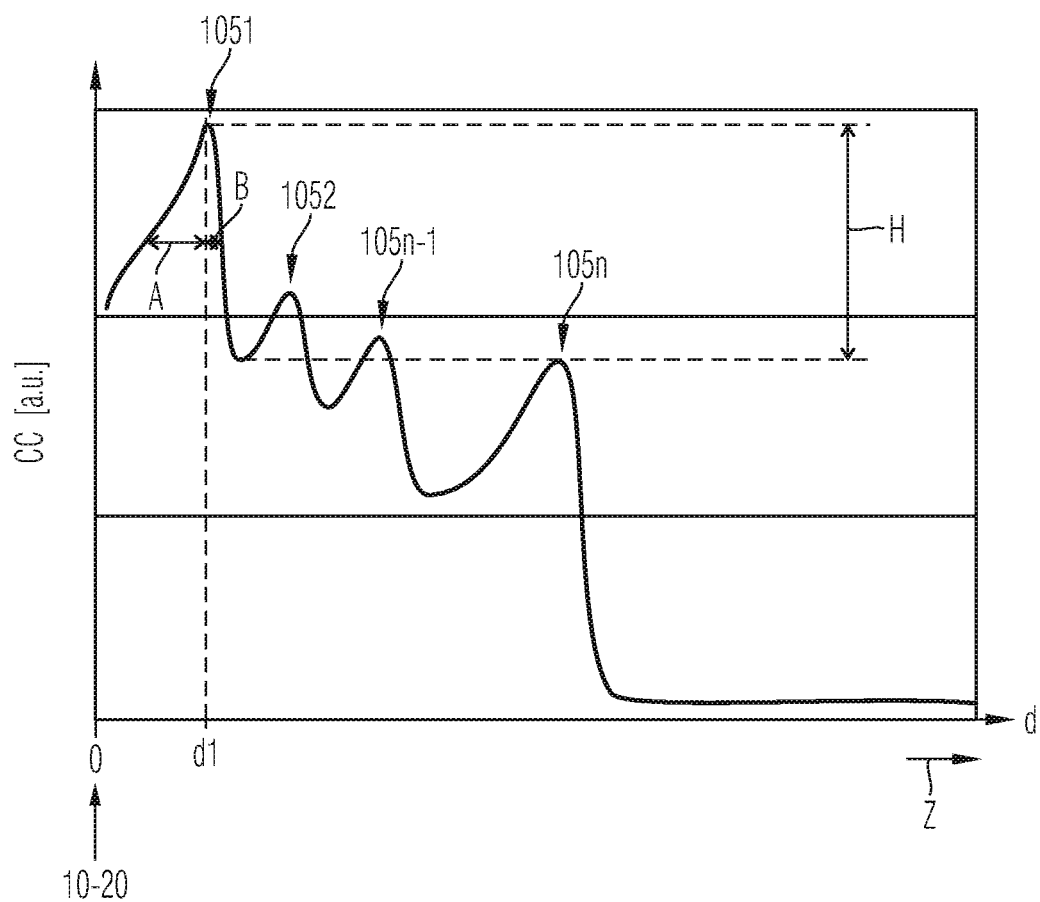
FIG. 6 schematically and exemplarily illustrates a donor concentration profile inside a field stop region in accordance with one or more embodiments.

In an embodiment in accordance with FIG. 6, the field stop region 105 may comprise a plurality of local maxima 1051, 1052, 105n-1, 105n, wherein the first local maximum 1051 is located closer to the backside surface 10-20 than each of the others of the plurality of local maxima 1052, 1053, 105n-1, 105n. The first local maximum 1051 may also be referred to as "the shallowest peak", since it is the shallowest of the local maxima 1051, 1052, 105n-1, 105n with respect to the backside surface 10-20. Further, an $n^{th}$ local maximum 105n of the plurality of local maxima 1051, 1052, 105n-1, 105n is located further away from the backside surface 10-20 than each of the others of the plurality of local maxima 1051, 1052, 105n-1. The nth local maximum may be referred to as "the deepest peak" because it is the deepest of the local maxima 1051, 1052, 105n-1, 105n with respect to the backside surface 10-20. In the exemplary embodiment of FIG. 6, the donor concentration profile inside the field stop region exhibits four local maxima (n=4). In other embodiments, a different number of local maxima, such as 2, 3, 5, 6, or even more than 6 local maxima may be provided.

In an embodiment, the donor concentration at the first local maximum 1051 is higher than the donor concentration at each of the others of the plurality of local maxima 1052, 105n-1, 105n. For example, the donor concentration at the first local maximum 1051 may exceed the respective donor concentrations at each of the others of the plurality of local maxima 1052, 105n-1, 105n at least by 50% or at least by 100%, such as, e.g., at least by a factor of 5.

In an embodiment, the donor concentration at the first local maximum 1051 is at least 1e15 cm$^{-3}$, such as at least 2e15 cm$^{-3}$. Further, in an embodiment, the donor concentration at the first local maximum 1051 is in the range from 10 to 5000 times, such as in the range from 20 to 2500 times a donor concentration of the drift region 100. For example, the donor concentration at the first local maximum 1051 may be in the range from 10 to 5000 times, such as in the range from 20 to 2500 times a mean concentration of dopants of the first conductivity type in the drift region 100.

Further, in accordance with an embodiment, the donor concentration at the $n^{th}$ local maximum (i.e., at the deepest donor concentration peak inside the field stop region 105) may be equal to or smaller than 500 times a donor concentration of the drift region 100, such as a mean donor concentration of the drift region 100.

For example, in an embodiment, the donor concentration at the $n^{th}$ local maximum 105n may be equal to or smaller than 2e15 cm$^{-3}$. For example, in an embodiment, the donor concentration at the $n^{th}$ local maximum 105n may be equal to or smaller than 5e14 cm$^{-3}$.

In an embodiment, the respective donor concentration at each of the plurality of local maxima 1051, 1052, 105n-1, 105n is in the range from 2 times to 5000 times a donor concentration of the drift region 100 or in the range from 5 times to 1000 times the donor concentration of the drift region 100, wherein said donor concentration of the drift region 100 may be a mean donor concentration inside the drift region 100.

For example, in an embodiment, the respective donor concentration at each of the plurality of local maxima 1051, 1052, 105n-1, 105n is in the range from 3e13 cm$^{-3}$ to 5e16 cm$^{-3}$ or in the range between 1e14 cm$^{-3}$ and 1e16 cm$^{-3}$.

Further, in an embodiment, the respective donor concentration at each of the plurality of local maxima 1052, 105n-1, 105n except for the first local maximum 1051 may be in the range from 2 times a donor concentration of the drift region 100 to 400 times the donor concentration of the drift region 100, wherein said donor concentration of the drift region 100 may be a mean donor concentration in the drift region 100. Further, in an embodiment, the respective donor concentration at each of the plurality of local maxima 1052, 105n-1, 105n except for the first local maximum 1051 may be in the range from 2 times a donor concentration of the drift region 100 to 125 times the donor concentration of the drift region 100, wherein said donor concentration of the drift region 100 may be a mean donor concentration in the drift region 100. Further, in an embodiment, the respective donor concentration at each of the plurality of local maxima 1052, 105n-1, 105n except for the first local maximum 1051 may be in the range from 2 times a donor concentration of the drift region 100 to 100 times the donor concentration of the drift region 100, wherein said donor concentration of the drift region 100 may be a mean donor concentration in the drift region 100.

In an embodiment, the respective donor concentration at each of the plurality of local maxima 1052, 105n-1, 105n except for the first local maximum 1051 may be in the range from $5e13$ $cm^{-3}$ to $1.6e15$ $cm^{-3}$. In an embodiment, the respective donor concentration at each of the plurality of local maxima 1052, 105n-1, 105n except for the first local maximum 1051 may be in the range from $5e13$ $cm^{-3}$ to $5e14$ $cm^{-3}$. In an embodiment, the respective donor concentration at each of the plurality of local maxima 1052, 105n-1, 105n except for the first local maximum 1051 may be in the range from $5e13$ $cm^{-3}$ to $4e14$ $cm^{-3}$.

Further, in an embodiment, the donor concentration at the plurality of local maxima 1052, 105n-1, 105n except for the first local maximum 1051 is constant or increases when going from one local maximum to a neighboring local maximum in the direction towards the backside surface 10-20.

In accordance with another embodiment (not illustrated), the donor concentration at the $n^{th}$ local maximum 105n is equal to or larger than a donor concentration at an (n−1)st local maximum 105n-1 neighboring the $n^{th}$ local maximum 105n, the (n−1)st local maximum 105n-1 being located closer to the backside surface 10-20 than the $n^{th}$ local maximum 105n.

Embodiments of a method of processing and/or producing a power semiconductor transistor correspond to the embodiments of the power semiconductor transistor described above with respect to the Figures. Hence, for example, the features of the embodiments of the power semiconductor device described above with reference to the Figures may be achieved by carrying out corresponding processing method steps. Embodiments of a method of processing a power semiconductor device may thus comprise providing a semiconductor body 10 and forming the respective structures being arranged in/on the semiconductor body 10 by processes such as masked or unmasked implantations and/or deposition of semiconductor layers and/or oxide layers.

In an embodiment, a method of processing a power semiconductor transistor 1, comprises providing a semiconductor body 10 having a front side 10-1 and a backside 10-2 with a backside surface 10-20 and creating a field stop region 105 inside the semiconductor body 10 by means of a at least one proton implantation step with a subsequent annealing step, wherein the implantation is carried out through the backside surface 10-20. Besides protons other n-doping species can be used, e.g. Phosphorous, Selenium, etc.

Figure 7A:
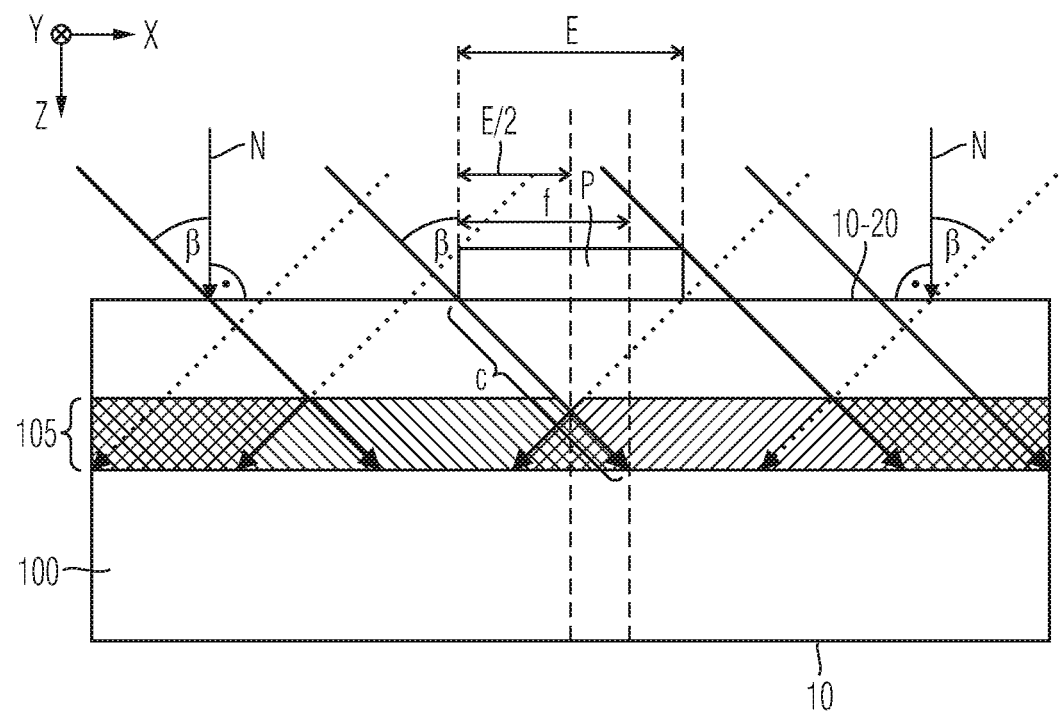
FIGS. 7A-7B each schematically and exemplarily illustrate a proton implantation step for the creation of a field stop region in accordance with one or more embodiments.
Figure 7B:
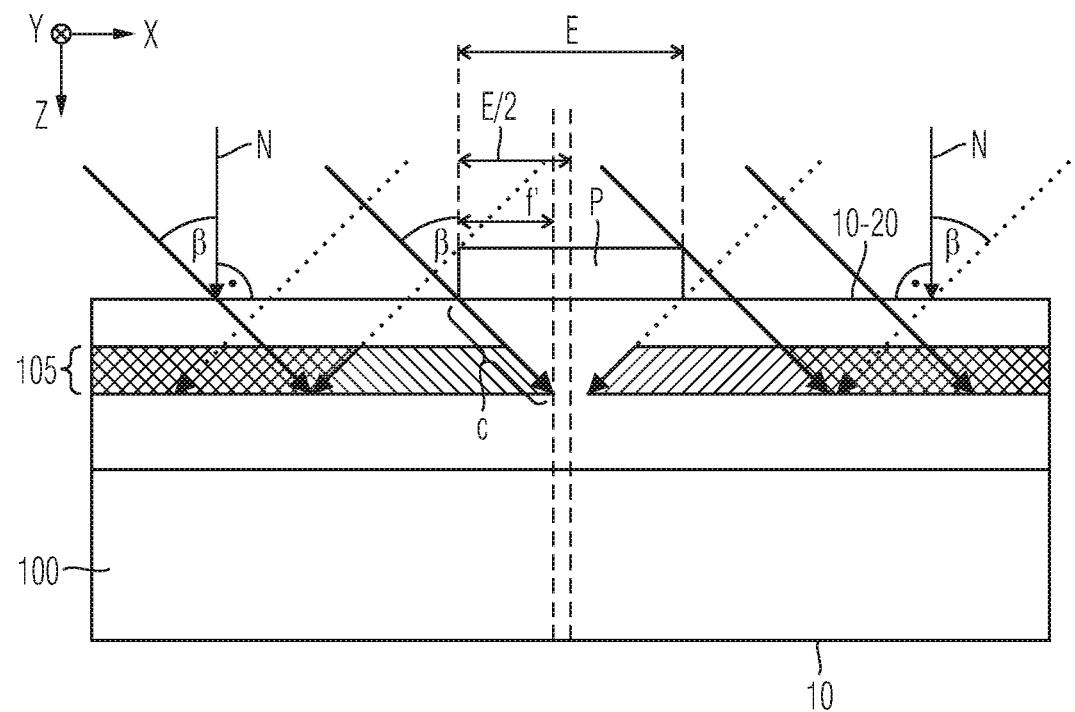

In an embodiment in accordance with FIGS. 7A-B, the proton implantation is carried out at an implantation angle β with respect to a backside surface normal N pointing from the backside 10-2 to the front side 10-1 (i.e., along the vertical direction Z), wherein the implantation angle β is in the range from 20° to 60°. Further, the implantation may be carried out at an implantation energy in the range from 100 keV to 800 keV, such as in the range from 100 keV to 600 keV. For example, in an embodiment, the implantation may be carried out at an implantation energy in the range from 200 keV to 400 keV. An implantation dose may be chosen so that a resulting integrated hydrogen-related donor profile amounts to at least 20% or to at least 30%, such as at least 50%, of a break-through charge that is specific for the material of the semiconductor body 10. For example, the break-through charge for silicon is typically in the range from $0.5e12$ $cm^{-2}$ to $2.0e12$ $cm^{-2}$.

For example, a field stop region 105 comprising a donor concentration profile as described above with reference to FIGS. 1 to 6 may be formed by means of the at least one proton implantation step with a subsequent annealing step.

In an embodiment, the method comprises a plurality, e.g. at least two, of such proton implantation steps, which may differ from one another in that the implantation is carried out from different azimuthal directions with respect to the backside surface 10-20. For example, the solid arrows in FIGS. 7A-B may represent a first implantation step at an implantation angle β carried out from a first azimuthal angle, and the dotted arrows may represent a second implantation step carried out at the same implantation angle β, but from a second azimuthal angle that is shifted by 180° with respect to the first azimuthal angle.

Figure 4:
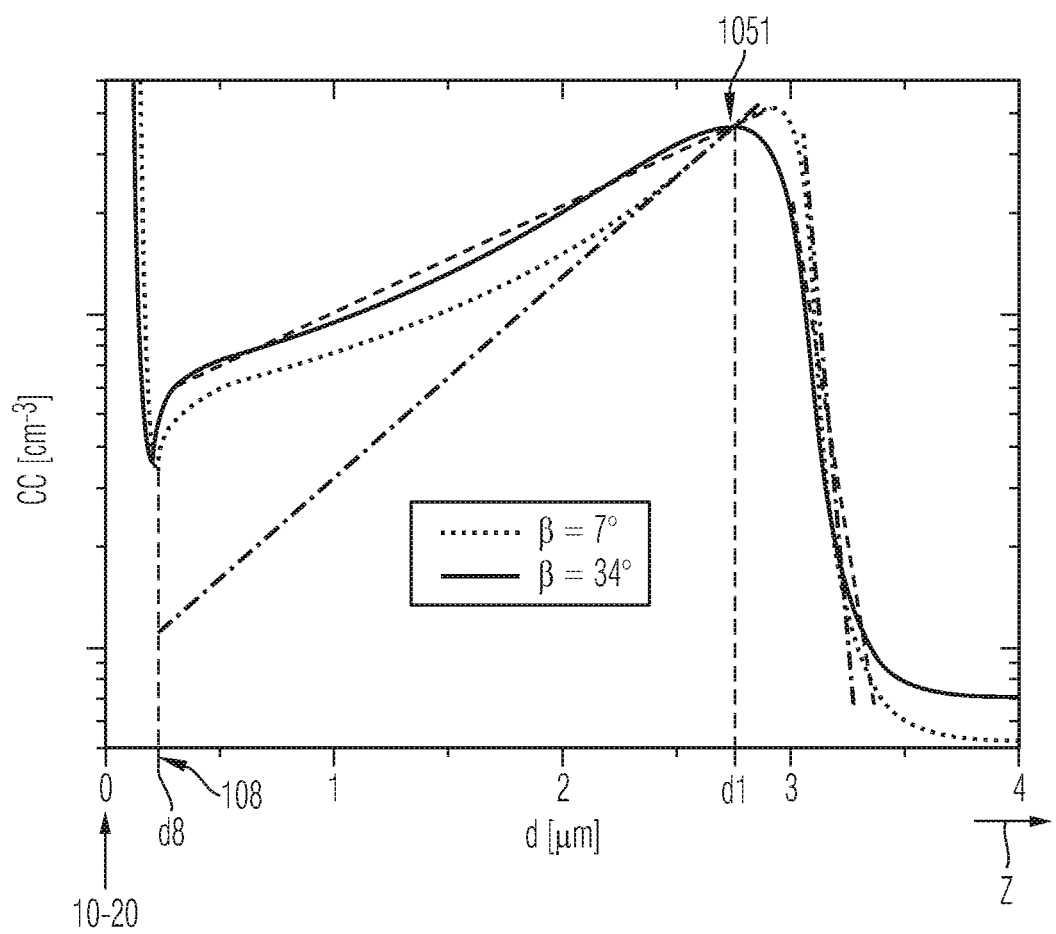
FIG. 4 schematically and exemplarily illustrates a donor concentration profile inside a field stop region in accordance with one or more embodiments.

For example, the donor concentration profile corresponding to the solid curve in FIG. 4 is the result of a so-called quad mode implantation, i.e., an implantation from four different azimuthal angles. In each of the four implantation steps that have resulted in the donor concentration profile illustrated in the solid curve in FIG. 4, the implantation angle with respect to a surface normal of the backside 10-20 was β=34°. For comparison, the dotted curve in FIG. 4 shows a donor concentration profile resulting from a single mode implantation, i.e., an implantation that was carried out from only one azimuthal direction, at an implantation angle with respect to a surface normal of the backside 10-20 of α=7°. The dashed lines and the dot-dashed lines in FIG. 4 show that the "slopes" (in the logarithmic representation) on both sides of the local maximum 1051 are considerably shallower as a result of the quad mode implantation at the relatively large implantation angle of β=34° as compared to the single mode process at the small implantation angle of β=7°. At the same time, the respective implantation depths, i.e., the positions of the respective peaks, are very similar.

It has been found that by means of one or more implantations at relatively large implantation angles β, and possibly from several different azimuthal directions, the "slopes" of the proton peaks (as exemplarily indicated with the dashed lines in FIG. 4) may be varied continuously in a range from 0% to −100% as compared to standard implantation conditions (cf. dot-dashed lines in FIG. 4). For example, the vertical extension of the falling branch of the peak 1051 in the direction of the front side 10-1 may thus be increased so as to amount to at least 15%, or even at least 25% of a penetration depth of an end-of-range of the proton implantation. For example, such a relatively shallow decrease towards the front side 10-1 may yield a softer turn-off behavior and a better short-circuit ruggedness as compared to a standard donor concentration profile in the field stop region 105. For example, by means of a step-wise or continuous variation of the implantation angle β and/or of the azimuthal angle, a continuous transition between the two exemplary donor concentration profiles illustrated in FIG. 4 may be achieved.

In an embodiment, one or more implantation steps as described above may be combined with further implantation steps carried out a smaller implantation angles or even at an implantation angle of β=0°. For example, a number of further peaks 1052, 105n-1, 105n as exemplarily illustrated in FIG. 6 may be formed by implantation steps at smaller implantation angles.

Further, in an embodiment, creating the field stop region 105 may further comprise an irradiation of Helium through the backside surface 10-20. In other words, the implantation described above may be combined with an irradiation of Helium. For example, a lateral homogeneity of the donor distribution within the field stop region 105 may thus be further improved. For example, such a Helium irradiation may be carried out through the backside surface 10-20 at an implantation at an appropriate implantation angle (e.g. at 7°) and an appropriate implantation energy (e.g. at 1.3 MeV), so as to cause vacancies in the field stop region 105, wherein a local maximum of a concentration of vacancies may be located roughly at the first distance d1 from the backside surface 10-20, i.e., at or close to the position of the first local maximum 1051. For example, during the aforementioned annealing step, vacancies caused by the Helium irradiation may be decorated by Hydrogen, thereby "closing" defects in the primary Hydrogen profile.

Further, in an embodiment in accordance with FIGS. 7A-B, a plurality of particles P, such as e.g. resist residuals, silicon particles, oxide particles etc., may be present on the backside surface 10-20 during the at least one proton implantation step. In FIG. 7A-B, only one representative particle P is shown for the purpose of illustration. For example, the particles may have a maximal lateral extension E. The exemplary particle P may be modelled as a cylindrical particle having a diameter E and a radius E/2. For example, the diameter E may amount to 10 µm. As explained above, in FIGS. 7A-B two implantations (corresponding to the solid and dotted arrows, respectively) are carried out at the same implantation angle β=45°, but from two different azimuthal angles, which differ from one another by 180°. The first implantation (solid arrows) creates first doped regions inside the field stop region 105, which are hatched from top left to bottom right in FIGS. 7A-B. The second implantation (dotted arrows) creates second doped regions inside the field stop region 105, which are hatched form bottom left to top right in FIGS. 7A-B. Further, checkered regions inside the field stop region 105 mark regions that have been reached by both the first and the second implantation. In other words, the respective ends of range of the first and second implantations overlap in the checkered regions in FIGS. 7A-B.

From a comparison of FIGS. 7A and B it is apparent that such an overlap region may or may not be formed underneath the particle P depending on the implantation angle β and a penetration depth c (which in turn depends on the implantation energy). In other words, as shown in FIG. 7B, there may be a "hole" or a relatively weakly doped region left in the field stop region 105 if the penetration depth c is too small and/or if the implantation angle β is too large. In order to ensure the existence of an overlap region, i.e., to avoid such "holes", the implantation parameters have to be chosen such that a lateral penetration f, i.e., a projection of the penetration depth c on the backside surface 10-20, amounts to at least the radius E/2. For example, in case the particle has a diameter of E=10 µm, the lateral penetration f should amount to at least the radius E/2=5 µm so as to ensure a laterally continuous field stop region 105, as illustrated in FIG. 7A. By contrast, in the exemplary embodiment of FIG. 7B, the lateral penetration f' is less than the radius E/2, resulting in a lateral interruption of the field stop region 105.

In an embodiment, the implantation angle β and/or the implantation energy are chosen, such that a resulting penetration depth c satisfies the equation:

$$c \geq \frac{E}{2\cos(90° - \beta)}$$

Thus, it may be ensured that the resulting field stop region is not laterally interrupted.

Additionally or alternatively, the implantation angle β and/or the implantation energy may be chosen, such that the resulting penetration depth c satisfies the equation:

$$c \leq 1.2 \cdot \frac{E}{2\cos(90° - \beta)}$$

This may ensure that a resulting end of range of the first donor concentration peak 1051, i.e., first distance d1 (cf. FIGS. 1-5), is not too large. For example, the resulting first distance d1 may thus be in the range from 0.3 µm to 4 µm, as explained above.

In an embodiment, the method may further comprise an annealing step after the at least one proton implantation step, wherein the annealing step is carried out at temperatures in the range from 360° C. to 440° C. or in the range from 380° C. to 420° C. Further, the annealing step may be carried out for a duration in the range from 30 minutes to 4 hours.

Further, in an embodiment in accordance with FIG. 8, a method of processing a power semiconductor transistor 1, comprises a step of structuring the backside 10-2 of a semiconductor body 10, such that a plurality of surface portions 10-21 are formed. The surface portion 10-21 differ from one another in that they have different orientations with respect to the backside surface normal N. For example, said structuring of the backside 10-2 comprises an etching process, such as by means of potassium hydroxide (KOH). Then, a field stop region 105 inside the semiconductor body 10 may be created by means of a at least one proton implantation step carried out through the backside surface 10-20, wherein a proton beam b is deflected by the plurality of surface portions 10-21 during the proton implantation step. For example, such an implantation process may be used instead of or in combination with an implantation at a relatively large implantation angle so as to create a relatively shallow and/or laterally homogeneous field stop region 105.

Figure 9:
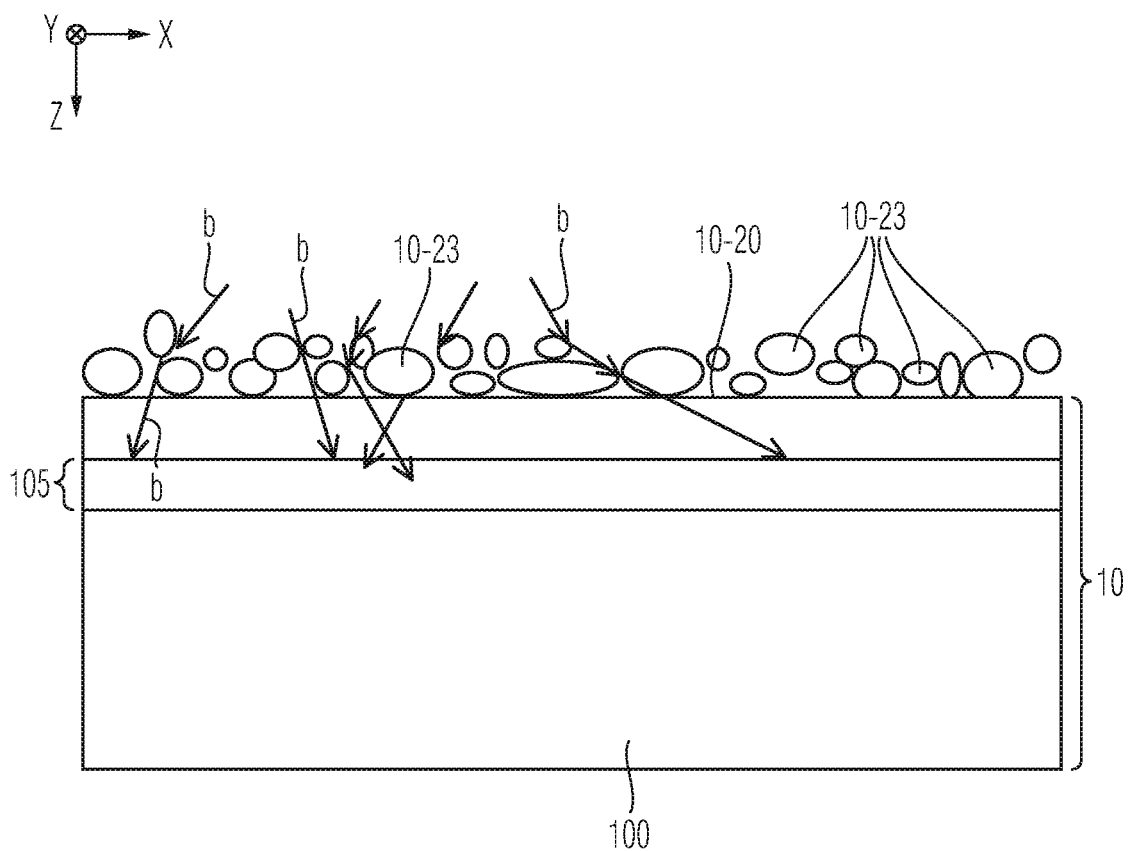
FIG. 9 schematically and exemplarily illustrates an amorphous backside surface of a semiconductor body in accordance with one or more embodiments.

In an embodiment in accordance with FIG. 9, an amorphous surface may be used for the same purpose. For example, a plurality of small scattering centers 10-23 may be arranged on the backside surface 10-20, wherein the scattering centers 10-23 may have a similar effect as the plurality of surface portions 10-21, as has been explained above with reference to FIG. 8.

The embodiments described above include the recognition that relevant properties of a power semiconductor transistor, such as an IGBT, may be critically influenced by a detailed course of a donor concentration profile inside a field stop region of the device.

For example, it has been recognized that improvements with regard to a short circuit ruggedness and/or with regard to a hot leakage current may be achieved by providing a laterally homogeneous donor concentration inside the field stop region, wherein a first peak of a vertical donor concentration profile inside the field stop region is situated relatively shallow with regard to the backside surface of the device. For example, by providing, as a consequence of such a laterally homogeneous donor concentration in the field stop region, a laterally homogenous amplification factor $\alpha_{pnp}$ of a partial transistor that is formed inside an IGBT, the short circuit ruggedness of the IGBT may be enhanced. One reason for this is that the homogeneity of the field stop region may prevent an unfavorable current filamentation. Therefore, it is possible to generally adjust the amplification factor $\alpha_{pnp}$ at a higher level. As a result, in a short circuit event, due to the homogeneous injection of holes, an unfavourable Umklapp effect of the electric field in front of the p-emitter of the IGBT may be avoided even at very high current densities Further, by avoiding a local increase of the amplification factor $\alpha_{pnp}$ the risk of a latch-up of the transistor, which may occur due to a locally enhanced hole density at the front side, possibly enhanced by dynamic avalanche, may be reduced.

A locally increased amplification factor $\alpha_{pnp}$ may also lead to a significant increase of the hot leakage current resulting in detrimental hotspots. Thus, by providing a laterally homogeneous field stop region, it is also possible to reduce the hot leakage current. An improvement of the thermal short circuit ruggedness of the power semiconductor transistor can therefore be achieved.

Further, the detailed course of the vertical donor concentration profile may influence the changes of the current and the voltage at the end of a switching process of the power semiconductor transistor. Thus, for example, the turn-off softness of the transistor may be improved by providing a relatively smooth decay of the shallowest field stop peak in the direction of the drift region. In other words, e g., a relatively large front width at half maximum of the shallowest peak may help to increase the turn-off softness.

In accordance with one or more embodiments, a power semiconductor transistor comprises a field stop region, wherein, in a cross-section along a vertical direction pointing from the backside to the front side, a donor concentration profile exhibits a first local maximum at a first distance from a backside surface of the device and a front width at half maximum associated with the first local maximum, wherein the front width at half maximum amounts to at least 8% of the first distance.

Further, in accordance with one or more embodiments, it is proposed to create a field stop region of a power semiconductor transistor, which may have some or all of the properties described above, by means of one or more proton implantation steps, wherein the implantation is carried out at an implantation angle in the range from 20° to 60°, at an implantation energy in the range from 100 keV to 1600 keV, from 100 keV to 800 keV, from 100 keV to 600 keV, or from 200 keV to 400 keV, and with an implantation dose yielding an integral of a resulting donor concentration profile in the field stop region of at least 20% of a break-through charge that is specific for the material of the semiconductor body. By means of such implantation processes at various angles, the donor concentration profile may be varied continuously, thereby providing a tool for tailoring the switching behavior of the transistor.

Further, in accordance with one or more embodiments a method of processing a power semiconductor transistor comprises structuring the backside of a semiconductor body, such that a plurality of surface portions are formed, which differ from one another in that they have different orientations with respect to a backside surface normal and creating a field stop region inside the semiconductor body by means of a at least one proton implantation step carried out through the backside surface, wherein a proton beam is deflected by the plurality of surface portions during the proton implantation step.

Features of further embodiments are defined in the dependent claims. The features of further embodiments and the features of the embodiments described above may be combined with each other for forming additional embodiments, as long as said features are not explicitly described as being alternative to each other.

In the above, embodiments pertaining to a power semiconductor transistor, such as an IGBT or a MOSFET, and corresponding processing and producing methods were explained. For example, these devices are based on silicon (Si). Accordingly, a monocrystalline semiconductor region or layer, e.g., the semiconductor body 10 and its regions/zones 100, 102, 103, 104, 105 and 107 can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor device applications currently mainly Si, SiC, GaAs and GaN materials are used.

Spatially relative terms such as "under", "below", "above", "lower", "over", "upper" and the like, are used for ease of description to explain the positioning of one element relative to a second element. These terms are intended to encompass different orientations of the respective device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor transistor, comprising:
a semiconductor body having a front side and a backside with a backside surface,
wherein the semiconductor body includes a drift region of a first conductivity type and a field stop region of the first conductivity type,
wherein the field stop region is arranged between the drift region and the backside,
wherein the field stop region comprises, in a cross-section along a vertical direction from the backside to the front side, a concentration profile of donors of the first conductivity type that has: a first local maximum at a first distance from the backside surface, a front width at half maximum associated with the first local maximum, and a back width at half maximum associated with the first local maximum,
wherein the front width at half maximum is smaller than the back width at half maximum and amounts to at least 8% of the first distance.

2. The power semiconductor transistor of claim 1, wherein the front width at half maximum is smaller than half of the back width at half maximum.

3. The power semiconductor transistor of claim 1, wherein an integral of the donor concentration profile in the field stop region amounts to at least 20% of a break-through charge that is specific for a material of the semiconductor body.

4. The power semiconductor transistor of claim 1, wherein the first distance is equal to or smaller than 4 μm and/or equal to or larger than 0.3 μm.

5. The power semiconductor transistor of claim 1, wherein the front width at half maximum is at least 0.225 μm, and/or wherein the back width at half maximum is at least 0.675 μm, and/or wherein a full width at half maximum associated with the first local maximum is at least 0.9 μm.

6. The power semiconductor transistor of claim 1, wherein at least 80% of the donors in the field stop region are hydrogen induced donors.

7. The power semiconductor transistor of claim 1, wherein at a distance of 250 nm from the position of the first local maximum in the direction of the front side, the donor concentration is at least 35% of the donor concentration at the first local maximum.

8. The power semiconductor transistor of claim 1, wherein at a distance of 375 nm from the position of the first local maximum in the direction of the front side, the donor concentration is at least 5% of the donor concentration at the first local maximum.

9. The power semiconductor transistor of claim 1, wherein at a distance of 500 nm from the position of the first local maximum in the direction of the backside, the donor concentration is at least 60% of the donor concentration at the first local maximum.

10. The power semiconductor transistor of claim 1, wherein at a distance of 1500 nm from the position of the first local maximum in the direction of the backside, the donor concentration is at least 25% of the donor concentration at the first local maximum.

11. The power semiconductor transistor of claim 1, wherein along at least 80% of an extension of the field stop region along a lateral direction perpendicular to the vertical direction, the donor concentration at the first local maximum varies by less than 10%, and/or wherein in an active area of the power semiconductor transistor, the donor concentration at the first local maximum varies by less than 10% along the lateral direction.

12. The power semiconductor transistor of claim 1, wherein the semiconductor body comprises a backside emitter region of a second conductivity type complementary to the first conductivity type, the backside emitter region being arranged at the backside, and wherein a transition between the backside emitter region and the field stop region forms a pn-junction.

13. The power semiconductor transistor of claim 12, wherein a current amplification factor $\alpha_{pnp}$ of a partial transistor formed by the backside emitter region, the field stop region, the drift region and a body region of at least one control cell varies by less than 10% along a lateral direction perpendicular to the vertical direction.

14. The power semiconductor transistor of claim 1, wherein the field stop region comprises a plurality of local maxima, wherein a first local maximum of the plurality of local maxima is located closer to the backside surface than each of the other local maxima of the plurality of local maxima, wherein an $n^{th}$ local maximum of the plurality of local maxima is located further away from the backside surface than each of the other local maxima of the plurality of local maxima, and wherein the donor concentration at the first local maximum is higher than the donor concentration at each of the other local maxima of the plurality of local maxima.

15. The power semiconductor transistor of claim 14, wherein the donor concentration at the first local maximum is at least $1e15$ cm$^{-3}$.

16. The power semiconductor transistor of claim 14, wherein the donor concentration at the $n^{th}$ local maximum is equal to or smaller than $2e15$ cm$^{-3}$, and/or wherein the donor concentration at the $n^{th}$ local maximum is equal to or smaller than 500 times a donor concentration of the drift region.

17. The power semiconductor transistor of claim 14, wherein the respective donor concentration at each of the plurality of local maxima is in the range from $3e13$ cm$^{-3}$ to $5e16$ cm$^{-3}$.

18. The power semiconductor transistor of claim 14, wherein the respective donor concentration at each of the plurality of local maxima except for the first local maximum is in a range from 2 times a donor concentration of the drift region to 400 times the donor concentration of the drift region, and/or wherein the respective donor concentration at each of the plurality of local maxima except for the first local maximum is in a range from $5e13$ cm$^{-3}$ to $1.6e15$ cm$^{-3}$.

19. The power semiconductor transistor of claim 14, wherein the donor concentration at each of the plurality of local maxima except for the first local maximum is constant or increases when going from one local maximum to a neighboring local maximum in a direction towards the backside surface.

20. The power semiconductor transistor of claim 14, wherein the donor concentration at the $n^{th}$ local maximum is equal to or larger than a donor concentration at an $(n-1)$st local maximum neighboring the $n^{th}$ local maximum, the (n−1)st local maximum being located closer to the backside surface than the n$^{th}$ local maximum.

21. A method of processing a power semiconductor transistor, the method comprising:
provided a semiconductor body having a front side and a backside with a backside surface; and
forming a field stop region inside the semiconductor body by at least one proton implantation step,
wherein the at least one proton implantation step is carried out through the backside surface:
at an implantation angle with respect to a backside surface normal, the implantation angle being in the range from 20° to 60°;
at an implantation energy in a range from 100 keV to 800 keV; and
with an implantation dose yielding an integral of a resulting donor concentration profile in the field stop region of at least 20% of a break-through charge that is specific for a material of the semiconductor body.

22. The method of claim 21, wherein the field stop region is formed inside the semiconductor body by a plurality of proton implantation steps which differ from one another in that each proton implantation step is carried out from different azimuthal directions with respect to the backside surface.

23. The method of claim 21, wherein a plurality of particles are present on the backside surface, the particles having a maximal lateral extension (E), and wherein the implantation angle (β) and/or the implantation energy are chosen such that a resulting penetration depth (c) satisfies the equation:

$$c \geq \frac{E}{2\cos(90° - \beta)}.$$

24. The method of claim 23, wherein the implantation angle (β) and/or the implantation energy are chosen such that the resulting penetration depth (c) satisfies the equation:

$$c \leq 1.2 \cdot \frac{E}{2\cos(90° - \beta)}.$$

25. The method of claim 21, wherein creating the field stop region further comprises an irradiation of Helium through the backside surface.

26. The method of claim 21, further comprising:
after the at least one proton implantation step, an annealing step carried out at temperatures in a range from 360° C. to 440° C. for a duration in a range from 30 minutes to 4 hours.

27. A method of processing a power semiconductor transistor, the method comprising:
providing a semiconductor body having a front side and a backside, the backside having a surface defined by a backside surface normal;
structuring the backside such that a plurality of surface portions are formed, which differ from one another in that the surface portions have different orientations with respect to the backside surface normal; and
forming a field stop region inside the semiconductor body by at least one proton implantation step carried out through the backside surface, wherein a proton beam is deflected by the plurality of surface portions during the at least one proton implantation step.

* * * * *